(12) United States Patent
Zeng et al.

(10) Patent No.: US 10,784,331 B2
(45) Date of Patent: Sep. 22, 2020

(54) DISPLAY PANEL AND DISPLAY DEVICE

(71) Applicant: Shanghai Tianma Micro-Electronics Co., Ltd., Shanghai (CN)

(72) Inventors: Yang Zeng, Shanghai (CN); Feng Lu, Shanghai (CN); Haochi Yu, Shanghai (CN); Qing Zhang, Shanghai (CN)

(73) Assignee: SHANGHAI TIANMA MICRO-ELECTRONICS CO., LTD., shanghai (CN)

( * ) Notice: Subject to any disclaimer, the term of this patent is extended or adjusted under 35 U.S.C. 154(b) by 0 days.

(21) Appl. No.: 16/455,319

(22) Filed: Jun. 27, 2019

(65) Prior Publication Data

US 2020/0203468 A1 Jun. 25, 2020

(30) Foreign Application Priority Data

Dec. 25, 2018 (CN) .......................... 2018 1 1594141

(51) Int. Cl.
*H01L 27/32* (2006.01)
(52) U.S. Cl.
CPC ...... *H01L 27/3279* (2013.01); *H01L 27/3246* (2013.01); *H01L 27/3258* (2013.01); *H01L 27/3262* (2013.01); *H01L 27/3265* (2013.01); *H01L 27/3272* (2013.01)
(58) Field of Classification Search
CPC ............. H01L 27/3279; H01L 27/3246; H01L 27/3258; H01L 27/3262; H01L 27/3265; H01L 27/3272
See application file for complete search history.

(56) References Cited

U.S. PATENT DOCUMENTS

| | | | | |
|---|---|---|---|---|
| 2014/0192243 | A1* | 7/2014 | Iwahori | H04N 5/3696 348/302 |
| 2018/0089491 | A1* | 3/2018 | Kim | G02B 6/0088 |
| 2019/0310724 | A1* | 10/2019 | Yeke Yazdandoost | H01L 51/5275 |

FOREIGN PATENT DOCUMENTS

| | | |
|---|---|---|
| CN | 103928495 A | 7/2014 |
| CN | 104733499 A | 6/2015 |
| CN | 108242453 A | 7/2018 |
| CN | 108242462 A | 7/2018 |
| CN | 108288681 A | 7/2018 |

* cited by examiner

*Primary Examiner* — Peniel M Gumedzoe
(74) *Attorney, Agent, or Firm* — Anova Law Group PLLC

(57) ABSTRACT

A display panel includes a substrate layer and an organic light-emitting display layer located above a side of the substrate layer. The organic light-emitting display layer includes a plurality of sub-pixels. The display panel also includes a light-shielding conductive layer located above a side of the substrate layer adjacent to the organic light-emitting display layer. The light-shielding conductive layer includes a plurality of small imaging apertures, and an orthographic projection of each small imaging aperture on the organic light-emitting display layer is at least partially located between adjacent sub-pixels. The display panel also includes a photosensitive device layer located below a side of the light-shielding conductive layer away from a light-emitting surface of the display panel. The display panel also includes a power signal layer electrically connected to the light-shielding conductive layer.

20 Claims, 9 Drawing Sheets

DISPLAY PANEL AND DISPLAY DEVICE

CROSS-REFERENCES TO RELATED APPLICATIONS

This application claims priority of Chinese Patent Application No. 201811594141.5, filed on Dec. 25, 2018, the entire contents of which are hereby incorporated by reference.

FIELD OF THE INVENTION

The present disclosure generally relates to the field of display technologies and, more particularly, relates to a display panel and a display device.

BACKGROUND

In display technologies, an organic light-emitting diode (OLED) display panel is characterized by its light weight, thin thickness, active illumination, fast response speed, wide viewing angle, rich color, high brightness, low power consumption, high and low temperature resistance, and the like. OLED display technology is recognized by industry as a third generation display technology after liquid crystal display (LCD) technology.

At present, OLED display panels are mainly a type of current-controlled illumination, and its illumination uniformity is also controlled by a corresponding electric current. However, due to factors such as its own resistance, a conductive layer for providing power signals may generate different voltage drops at different positions of an OLED display panel. Accordingly, power voltages supplied to different positions of the OLED display panel may not be uniform. As such, though pixels of the OLED display panel are driven by a same data driving signal, the electric currents flowing through different positions of the OLED display panel may be different, resulting in uneven display brightness. The display quality of the display panel may thus be affected.

Accordingly, improving uniformity of power signals in a display panel and improving display quality of a display panel are urgent technical problems that need to be solved. The disclosed methods and structures are directed to solve one or more problems set forth above and other problems in the art.

BRIEF SUMMARY OF THE DISCLOSURE

One aspect of the present disclosure includes a display panel. The display panel includes a substrate layer and an organic light-emitting display layer located above a side of the substrate layer. The organic light-emitting display layer includes a plurality of sub-pixels. The display panel also includes a light-shielding conductive layer located above a side of the substrate layer adjacent to the organic light-emitting display layer. The light-shielding conductive layer includes a plurality of small imaging apertures, and an orthographic projection of each small imaging aperture on the organic light-emitting display layer is at least partially located between adjacent sub-pixels. The display panel also includes a photosensitive device layer located below a side of the light-shielding conductive layer away from a light-emitting surface of the display panel. The display panel also includes a power signal layer electrically connected to the light-shielding conductive layer.

Another aspect of the present disclosure includes a display device. The display device includes a display panel comprising a substrate layer and an organic light-emitting display layer located above a side of the substrate layer. The organic light-emitting display layer includes a plurality of sub-pixels. The display panel also includes a light-shielding conductive layer located above a side of the substrate layer adjacent to the organic light-emitting display layer. The light-shielding conductive layer includes a plurality of small imaging apertures, and an orthographic projection of each small imaging aperture on the organic light-emitting display layer is at least partially located between adjacent sub-pixels of the plurality of sub-pixels. The display panel also includes a photosensitive device layer located below a side of the light-shielding conductive layer away from a light-emitting surface of the display panel. The display panel also includes a power signal layer electrically connected to the light-shielding conductive layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present invention more clear and explicit, the present invention is described in further detail with accompanying drawings and embodiments. It should be understood that the specific exemplary embodiments described herein are only for explaining the present invention and are not intended to limit the present invention.

Reference will now be made in detail to exemplary embodiments of the present invention, which are illustrated in the accompanying drawings. Wherever possible, the same reference numbers will be used throughout the drawings to refer to the same or like parts.

It should be noted that arrangements of components and steps, numerical expressions and numerical values set forth in exemplary embodiments are not intended to limit the scope of the present disclosure.

Techniques, methods and apparatus known to those skilled in the relevant art may not be discussed in detail, but where appropriate, these techniques, methods and apparatus should be considered as a part of the disclosed embodiments.

Figure 1:
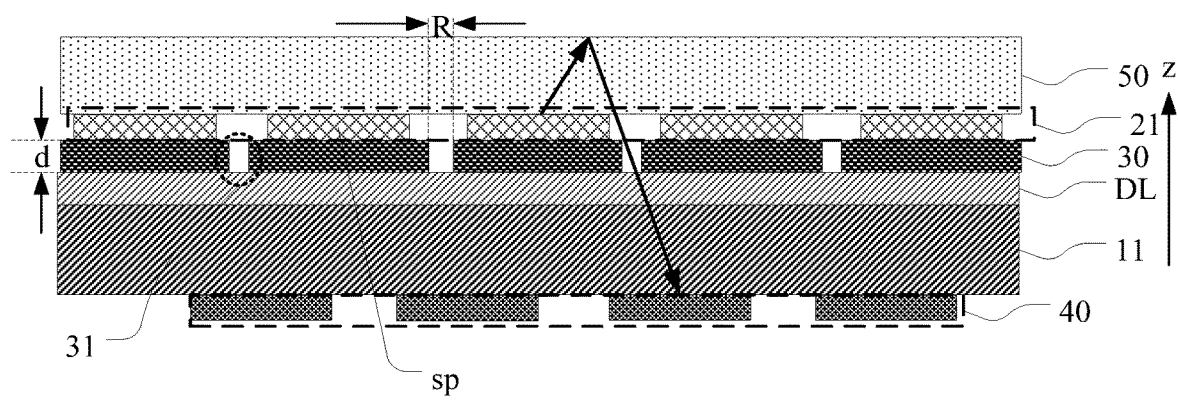
FIG. 1 illustrates a film layer structure of an exemplary display panel consistent with the disclosed embodiments.

The present disclosure provides a display panel. FIG. 1 illustrates a film layer structure of an exemplary display panel. As shown in FIG. 1, a cover 50 of the display panel is disposed on a side of a light-emitting surface of the display panel. Objects, such as fingers, may touch the cover 50 during a touch-control operation.

The display panel includes a substrate layer 11 and an organic light-emitting display layer 21 located above a side of the substrate layer 11. The organic light-emitting display layer 21 includes a plurality of sub-pixels sp. The display panel also includes a light-shielding conductive layer 30 located above a side of the substrate layer 11 adjacent to the organic light-emitting display layer 21. The light-shielding conductive layer 30 includes a plurality of small imaging apertures 31. Orthographic projections of the small imaging apertures 31 on the organic light-emitting display layer 21 are at least partially located between adjacent sub-pixels sp. The light-shielding conductive layer 30 has both light shielding and electric conduction functions.

The display panel also includes a photosensitive device layer 40 located below a side of the light-shielding conductive layer 30 away from the light-emitting surface of the display panel. Light reflected back from a contact surface between the cover 50 and a finger may pass through the small imaging apertures 31 and arrive at the photosensitive device layer 40. The display panel also includes a power signal layer DL electrically connected to the light-shielding conductive layer 30. The power signal layer DL may transmit power signals in the display panel. The power signal layer DL may be a film layer for transmitting a positive power signal (PVDD), or a film layer for transmitting a negative power signal (PVEE). The power signal layer DL may be located at any position in the display panel, and the light-shielding conductive layer 30 and the power signal layer DL may be electrically connected through a via hole or a bridge.

It should be noted that FIG. 1 and other film layer structural views in the present disclosure are only used to schematically show relative positional relationships of film layers in exemplary display panels. Other film layers may be disposed between the film layers in the film layer structures. Each of the film layers, based on their actual functions, may be a patterned structure or an entire layer structure.

In one embodiment, the display panel includes a photosensitive device layer 40 and a light-shielding conductive layer 30 disposed with small imaging apertures 31. When light generated by an external fingerprint recognition light source or an organic light-emitting display layer 21 used as a fingerprint recognition light source reaches a contact surface between a cover 50 and a finger, reflection may occur at the contact surface. Reflected light arrives at the photosensitive device layer 40 through the small imaging aperture 31. When a diameter of the small imaging aperture 31 is small enough, a fingerprint image may be formed, based on a principle of small aperture imaging, on the photosensitive device layer 40. Fingerprint recognition may thus be achieved.

In one embodiment, a material with both light shielding and electric conduction functions is used in forming a film layer where small imaging apertures are disposed. Accordingly, the film layer formed is a light-shielding conductive layer. Fingerprint recognition may be achieved based on small aperture imaging. Further, the light-shielding conductive layer may be electrically connected to a power signal layer. In a transmission path of power signals, the light-shielding conductive layer may act as a parallel resistance of the power signal layer. Accordingly, an impedance of a transmission line of the power signals may be reduced, and a voltage drop gradient of the power signals may thus be reduced. As such, uniformity of the power signals in the display panel may be improved, and the display quality of the display panel may thus be improved.

In addition, by electrically connecting the light-shielding conductive layer and the power signal layer that are located on different film layers, the impedance of the transmission line of the power signals may be reduced. In such a configuration, the light-shielding conductive layer and the power signal layer may not interfere with each other.

When the light-shielding conductive layer and the power signal layer reuse a same film layer, to reduce the resistance of the transmission line for power signals, the film layer may be required to have a certain thickness. For example, for a metal film layer of titanium-aluminum-titanium material, a thickness of about 200 nanometers may be enough for a light shielding effect. To achieve a function of transmitting power signals, the thickness of the metal layer may need to be at least 700 nanometers.

When the thickness of the film layer satisfies the requirements for transmitting power signals, at positions of other holes that are opened in the film layer, there may be light, called leakage light, passing through the holes. For example, holes may be made to realize electrical connection between a layer above the film layer and a lower layer below the film layer. The leakage light may reach the photosensitive device layer, thus affecting an accuracy of fingerprint recognition.

In one embodiment, referring to FIG. 1, a film thickness d of the light-shielding conductive layer 30 is greater than or equal to about 150 nanometers and less than or equal to about 300 nanometers. When the film thickness d of the light-shielding conductive layer 30 is in this range, the light-shielding conductive layer 30 may provide a good light-shielding effect, and meanwhile, the light-shielding conductive layer 30 may greatly reduce the electric resistance of the power signal layer.

In one embodiment, the small imaging apertures 31 have a diameter R greater than or equal to about 5 micrometers and less than or equal to about 10 micrometers. When the diameter of the small imaging aperture 31 is within this range, the fingerprint images may be formed on the photosensitive device layer 40 based on the principle of aperture imaging.

In one embodiment, as shown in FIG. 1, the light-shielding conductive layer 30 is located between the substrate layer 11 and the organic light-emitting display layer 21. That is, the light-shielding conductive layer 30 is located below a non-light-emitting surface of the organic light-emitting display layer 21. Such a configuration may avoid the influence of the light-shielded conductive layer 30 on illumination and display of the display panel.

Figure 2:
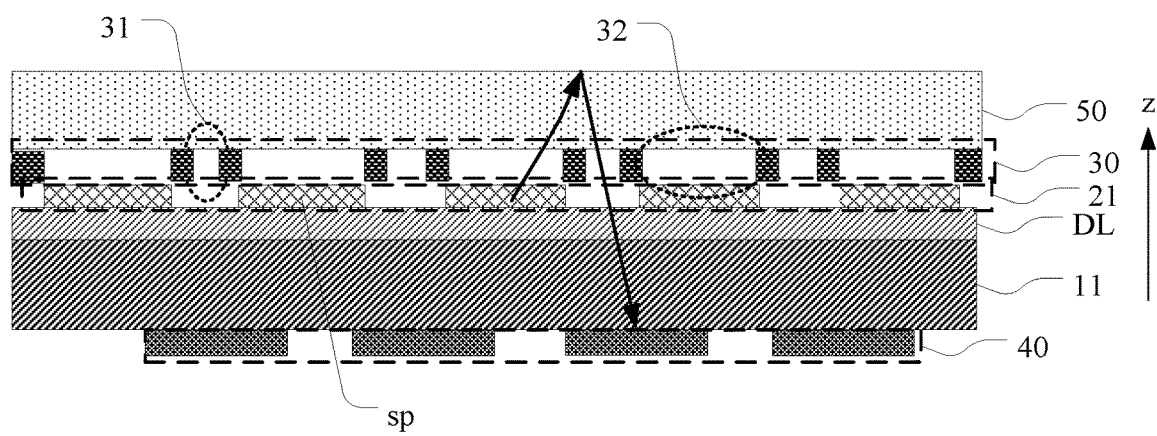
FIG. 2 illustrates a film layer structure of another exemplary display panel consistent with the disclosed embodiments.

FIG. 2 illustrates a film layer structure of another exemplary display panel. In one embodiment, as shown in FIG. 2, the light-shielding conductive layer 30 is located on a side of the organic light-emitting display layer 21 away from the substrate layer 11. The light-shielding conductive layer 30 is further disposed with pixel holes 32. The pixel holes 32 are disposed corresponding to the sub-pixels sp, thus light generated by the sub-pixels sp may be emitted through the pixel holes 32.

As shown in FIG. 1 and FIG. 2, the light-shielding conductive layer 30 may be located on either side of the organic light-emitting display layer 21. The photosensitive device layer 40 is located below a side of the light-shielding conductive layer 30 away from the light-emitting surface of the display panel. That is, the photosensitive device layer 40 is located a side of the light-shielding conductive layer 30 away from the cover 50. In such a configuration, light reflected back at a contact surface between a finger and the cover 50 may arrive at the photosensitive device layer 40 after passing through the imaging apertures 31.

To realize small aperture imaging, the light-shielding conductive layer 30 and the photosensitive device layer 40 may be separated at a certain distance in a thickness direction z of the display panel. The photosensitive device layer 40 may be located at a side of the substrate layer 11 away from the light-shielding conductive layer 30. In such a configuration, at least a substrate layer 11 is disposed between the photosensitive device layer 40 and the light-shielding conductive layer 30. For a rigid display panel, the substrate layer 11 may be a glass substrate, and the glass substrate may satisfy a required separation distance between the light-shielding conductive layer 30 and the photosensitive device layer 40. As such, no additional film layers are required to meet the distance requirement between the light-shielding conductive layer 30 and the photosensitive device layer 40. Accordingly, the thickness of the display panel may not be increased, and thin display panels may thus be achieved.

Figure 3:
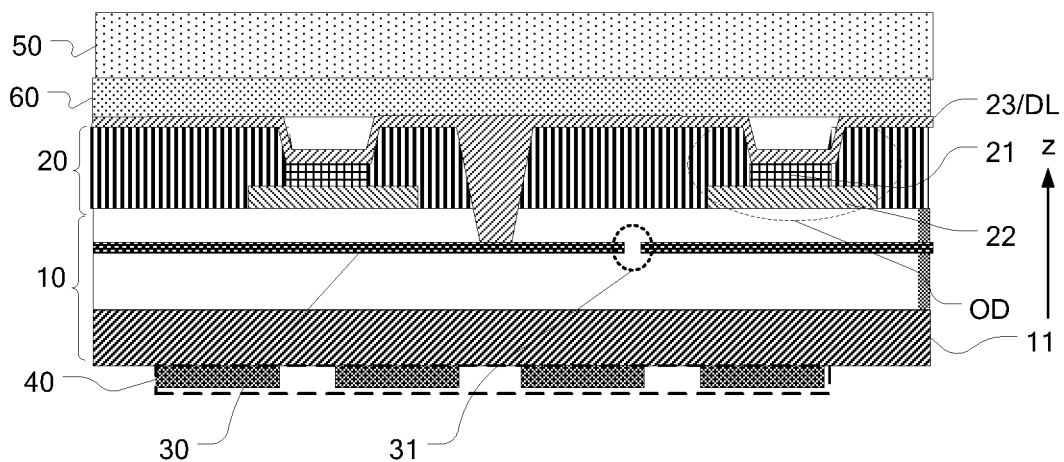
FIG. 3 illustrates a film layer structure of another exemplary display panel consistent with the disclosed embodiments.

FIG. 3 illustrates a film layer structure of another exemplary display panel. In one embodiment, as shown in FIG. 3, the display panel includes a first substrate 10 and a second substrate 60 that are opposite to each other in a direction z, and a light-emitting layer 20 disposed between the first substrate 10 and the second substrate 60. A cover 50 is disposed on a side of the second substrate 60 away from the first substrate 10. The light-emitting layer 20 includes a plurality of organic light-emitting devices OD, and each of organic light-emitting devices OD corresponds to one sub-pixel. Each of the organic light-emitting devices OD includes an anode 22, a cathode 23, and an organic light-emitting display layer 21 between the anode 22 and the cathode 23. The anodes 22 of the organic light-emitting devices OD are independent of each other; that is, each anode corresponds to one sub-pixel. The cathodes 23 of the respective organic light-emitting devices OD are connected to each other in a common entire layer structure; that is, the sub-pixel shares the cathode 23.

The display panel further includes a light-shielding conductive layer 30 and a photosensitive device layer 40. The light-shielding conductive layer 30 is located in a certain film layer of the first substrate 10 adjacent to the second substrate 60. The photosensitive device layer 40 is located on a side of the substrate layer 11 away from the second substrates 60.

The first substrate 10 may be an array substrate. A pixel circuit for controlling the organic light-emitting device OD in the display panel to emit light and a signal line for supplying a signal to the pixel circuit are disposed in the first substrate 10. An illumination current may be provided to the organic light-emitting device OD through the pixel circuit to control the light-emitting device to emit light.

Figure 4:
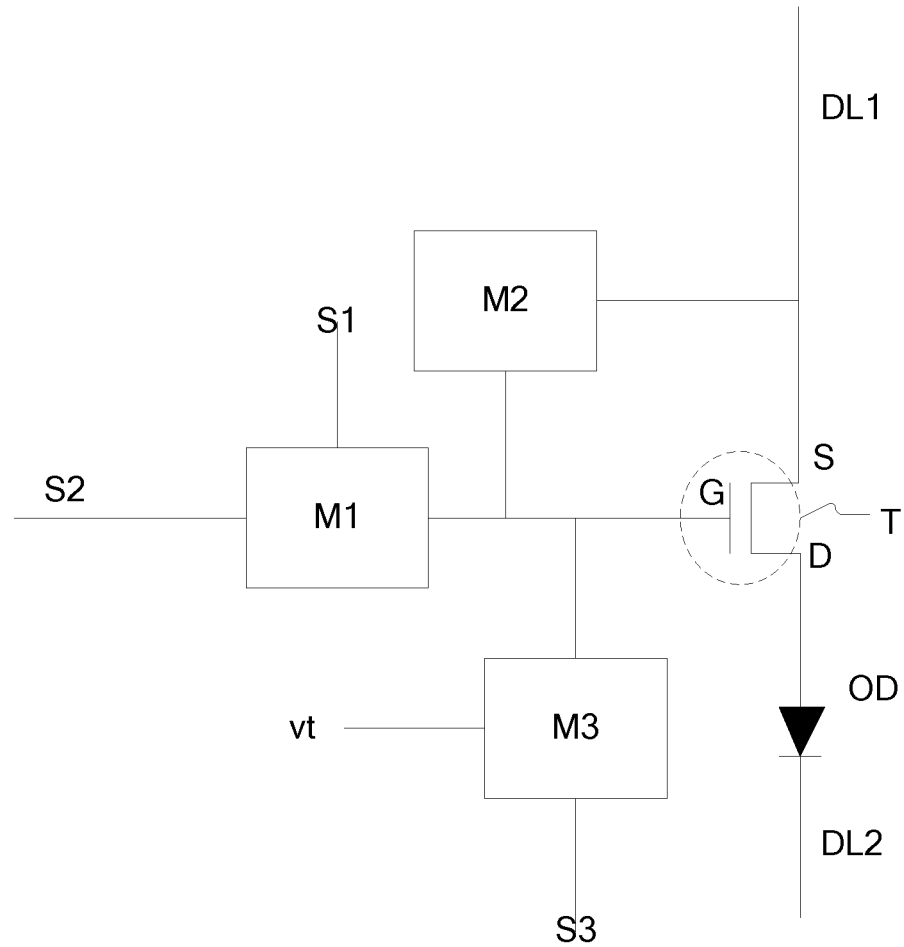
FIG. 4 illustrates a principle of a pixel circuit of an exemplary display panel consistent with the disclosed embodiments.

FIG. 4 illustrates a principle of a pixel circuit of an exemplary display panel. As shown in FIG. 4, the pixel circuit of each sub-pixels of the display panel includes a data writing module M1, a holding module M2, a control module M3, and a thin film transistor T working as a driving transistor. The thin film transistor T includes a gate G, a source S, and a drain D. With respect to specific configurations of the data writing module M1, the holding module M2, and the control module M3, reference may be made to related descriptions in the prior art, and details are not described herein.

Signal lines in the first substrate 10 that supply signals to the pixel circuit include a scan line S1, a data line S2, a control line S3, a first power signal line DL1, and a second power signal line DL2. The scan line 51 and the data line S2 are electrically connected to the data writing module M1. The thin film transistor T is electrically connected to the organic light-emitting device OD. In an off-phase, a control terminal of the control module M3 receives a control signal provided by a control line S3, and the control module M3 is turned on. A cutoff signal vt inputted from an input terminal of the control module M3 is written to the gate G of the thin film transistor T, controlling the thin film transistor T to operate in a completely off region. Then, the control module M3 is turned off according to the control signal written to the control terminal of the control module M3. The scan line S1 writes a scan driving signal to the control terminal of the data writing module M1, and the data write module M1 is turned on. The data line S2 writes a data driving signal to the gate G of the thin film transistor T. The source S of the thin film transistor T receives a positive power supply signal provided by the first power supply signal line DL1. The anode 21 of the organic light-emitting device OD is connected to the drain D of the thin film transistor T. The cathode 23 of the organic light-emitting device OD is connected to the second power signal line DL2 that provides a negative power signal.

The thin film transistor T generates a driving current corresponding to the data signal written by the gate G, and the driving current drives the organic light-emitting device OD to emit light. At the same time, the holding module M2 may maintain the gate voltage of the thin film transistor T, and the thin film transistor T continuously generates the driving current to drive the organic light-emitting device OD to continuously emit light.

The power signal layer in the display panel may be used to transmit a positive power signal, and the power signal layer may include the first power signal line DLL Or the power signal layer in the display panel may be used to transmit a negative power signal, and the power signal layer may include the second power signal line DL2 and/or the cathode 23.

In one embodiment, referring to FIG. 3 and FIG. 4, the power signal layer DL is the cathode 23. The cathode 23 may be a whole layer structure, and the light-shielding conductive layer 30 may be electrically connected to the cathode 23.

In one embodiment, the cathode is connected to the light-shielding conductive layer. In a negative power signal transmission path, the light-shielding conductive layer acts as a parallel resistance of the cathode, so the impedance of the line transmitting the negative power signal may be reduced. Accordingly, the voltage drop gradient of the negative power signal may be reduced, and thus the uniformity of the negative power signal in the display panel may be improved, and the display quality of the display panel may thus be improved.

Figure 5:
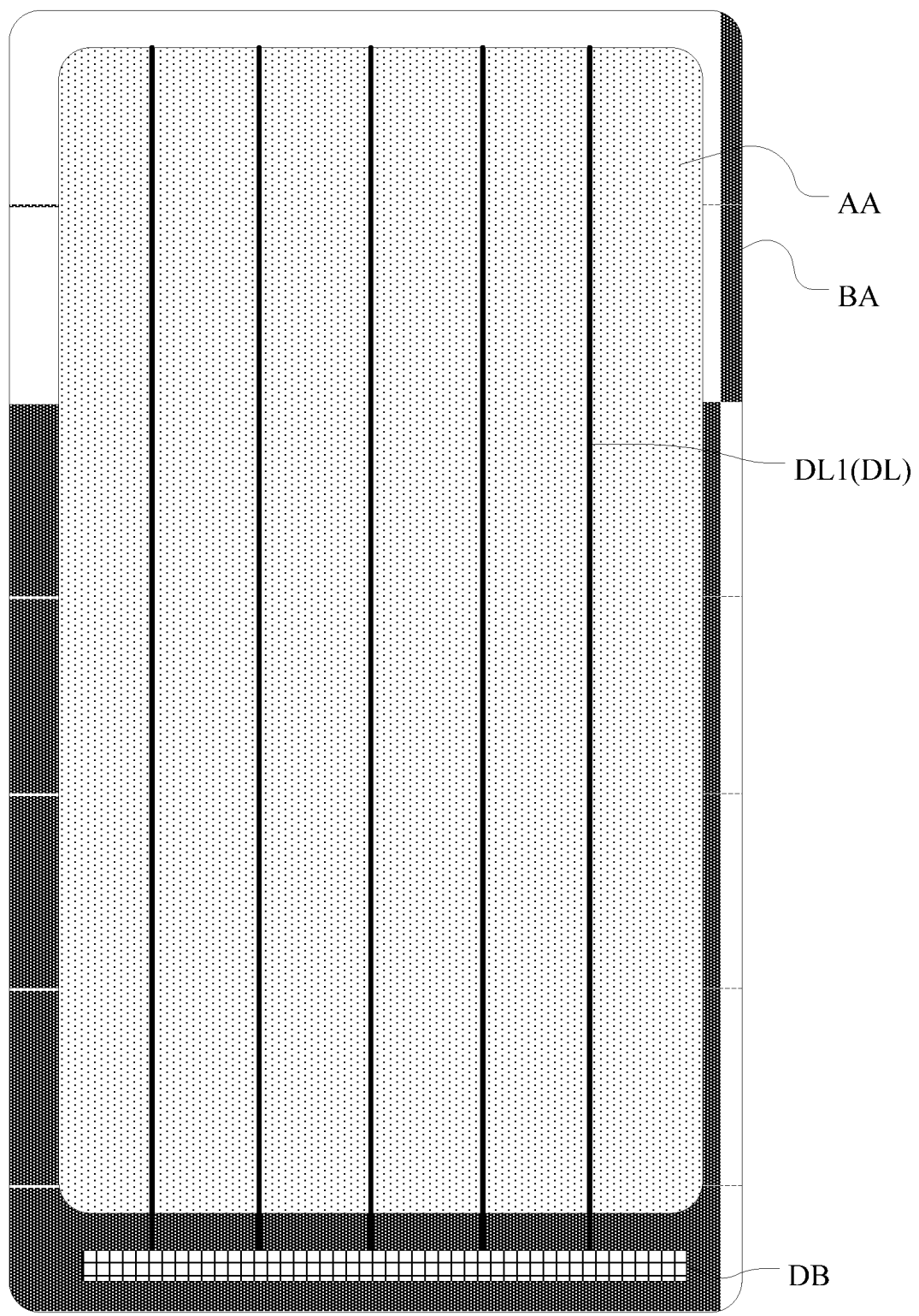
FIG. 5 illustrates a top view of an exemplary display panel consistent with the disclosed embodiments.
Figure 6:
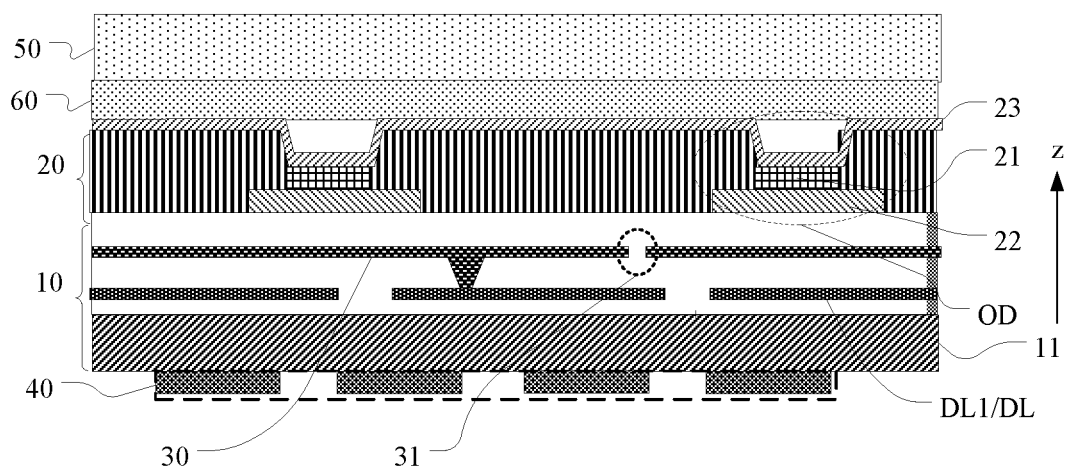
FIG. 6 illustrates a film layer structure of another exemplary display panel consistent with the disclosed embodiments.

FIG. 5 illustrates a top view of an exemplary display panel, and FIG. 6 illustrates a film layer structure of another exemplary display panel. In one embodiment, as shown in FIG. 4, FIG. 5 and FIG. 6, the display panel includes a display area AA and a border area BA surrounding the display area AA. The power signal layer DL is used for transmitting a positive power signal, and the power signal layer DL includes a plurality of first power signal lines DL1. The first power signal lines DL1 are located in the display area AA of the display panel. A positive power supply signal bus DB is disposed at the lower border of the display panel.

After the positive power supply signal bus DB receives a positive power signal outputted by an integrated circuit chip, the positive power signal is transferred to the display area AA through the first power signal lines DL1. The first power signal lines DL1 are located in one layer of the first substrate 10, and the first power signal lines DL1 and the light-shielding conductive layer 30 are located in different film layers. The light-shielding conductive layer 30 is electrically connected to the first power signal lines DL1.

In one embodiment, the first power signal lines are connected to the light-shielding conductive layer. In the positive power signal transmission path, the light-shielding conductive layer may act as a parallel resistance of the first power signal lines, so the impedance of the transmission line of the positive power signal may be reduced. Accordingly, the voltage drop gradient of the positive power signal may be reduced, and the uniformity of the positive power signal in the display panel may be improved. The display quality of the display panel may thus be improved.

Figure 7:
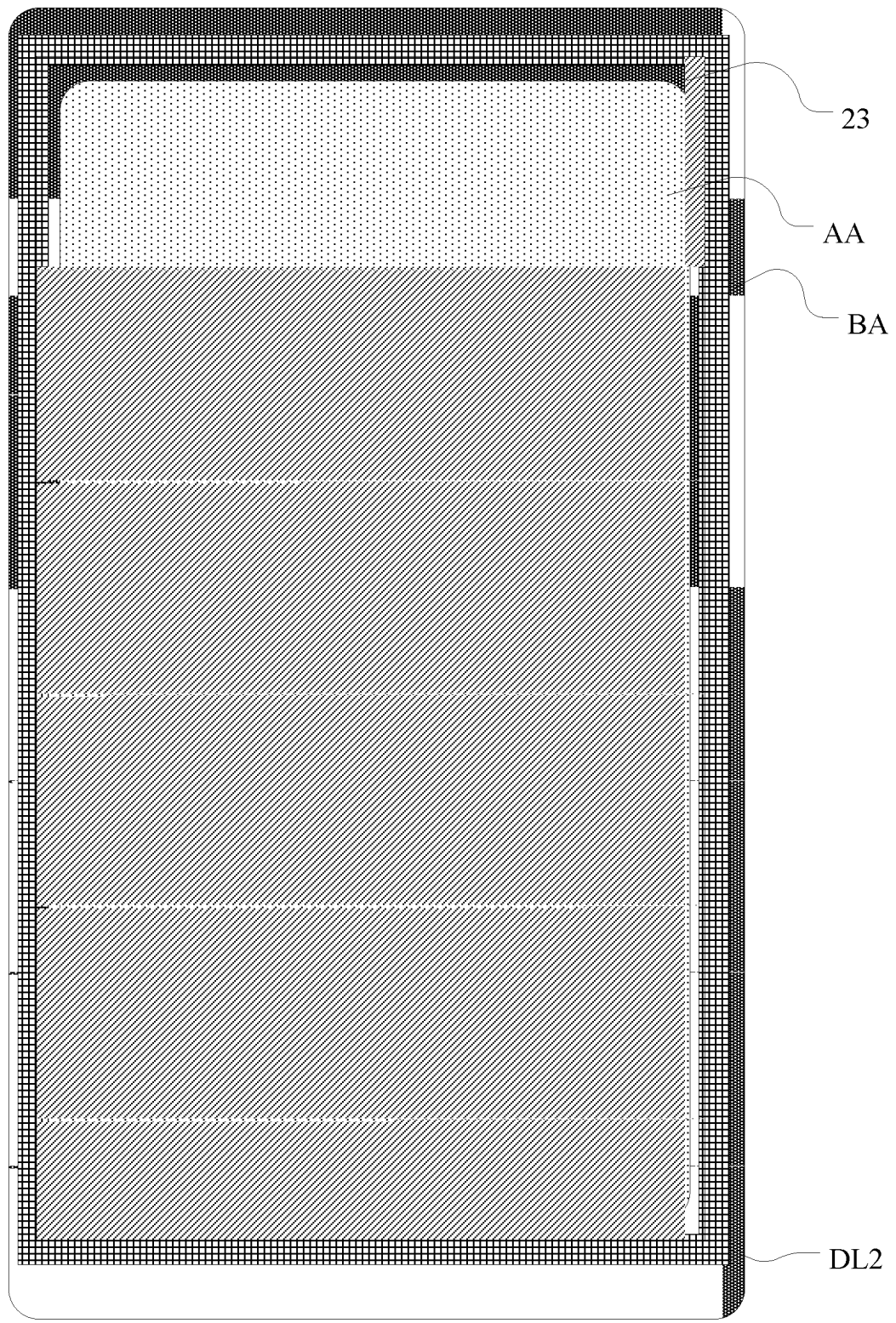
FIG. 7 illustrates a top view of another exemplary display panel consistent with the disclosed embodiments.
Figure 8:
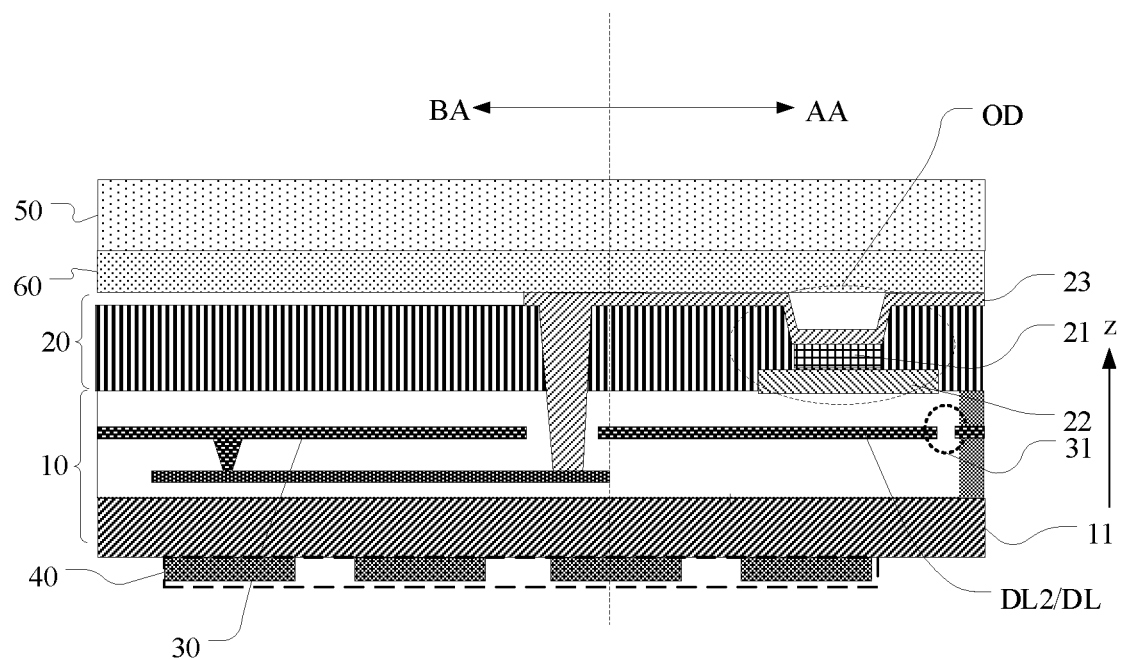
FIG. 8 illustrates a film layer structure of another exemplary display panel consistent with the disclosed embodiments.

FIG. 7 illustrates a top view of another exemplary display panel. FIG. 8 illustrates a film layer structure of another exemplary display panel. In one embodiment, as shown in FIG. 4, FIG. 7 and FIG. 8, the display panel includes a display area AA and a border area BA surrounding the display area AA. The power signal layer DL is used to transmit a negative power signal. The power signal layer DL includes a second power signal line DL2 surrounding the display area AA of the display panel. The second power signal line DL2 is located in the border area BA of the display panel, and is disposed in one layer of the first substrate 10. The second power signal line DL2 and the light-shielding conductive layer 30 are located in different film layers, and the light-shielding conductive layer 30 is electrically connected to the second power signal line DL2.

In one embodiment, the second power signal line is connected to the light-shielding conductive layer. In a negative power signal transmission path, the light-shielding conductive layer may act as a parallel resistance of the second power signal line, so the impedance of the transmission line of the negative power signal may be reduced. Accordingly, the voltage drop gradient of the negative power signal may be reduced, and thus the uniformity of the negative power signal in the display panel may be improved. Thus, the display quality of the display panel may be improved.

In addition, the cathode of the display panel is usually made of a conductive film (ITO). A thickness of the conductive film may directly affect the light transmittance and electric resistance of the cathode. A thicker film may have a smaller light transmittance and a smaller electric resistance, while a thinner film may have a greater light transmittance and a greater electric resistance. A cathode with a smaller light transmittance may have a greater loss of light. A cathode with a larger the resistance may have a greater voltage drop gradient of the negative power signal on the cathode, and the uniformity of the negative power signal on the display panel may be worse.

To minimize the loss of light at the cathode and the voltage drop gradient of the negative power signal on the cathode, it is necessary to set a suitable film thickness to balance the light transmittance and electric resistance of the cathode. Meanwhile, the cathode, the anode and the organic light-emitting display layer between the cathode and the anode constitute an optical micro-cavity. The light-emitting rate of the organic light-emitting display layer may be maximized by adjusting the micro-cavity effect of the optical micro-cavity. In adjusting the micro-cavity effect of the optical micro-cavity, the light transmittance of the cathode needs to be adjusted. Accordingly, based on the balance between the electric resistance and the light transmittance of the cathode, the transmittance of the cathode may only be adjusted within a certain range, and thus the range of adjusting the micro-cavity effect may be limited.

In one embodiment, the light-shielding conductive layer is connected to the second power signal line or the cathode to reduce the voltage drop gradient of the negative power signal on the cathode. That is, the voltage drop gradient of the negative power signal on the cathode may be reduced from another dimension instead of the thickness of the cathode. Accordingly, in the process of balancing between the light transmittance and the electric resistance of the cathode, the adjustment range of the transmittance may be increased. Thus, the adjusting range of the micro-cavity effect may be increased, and the display quality may thus be improved.

Figure 9:
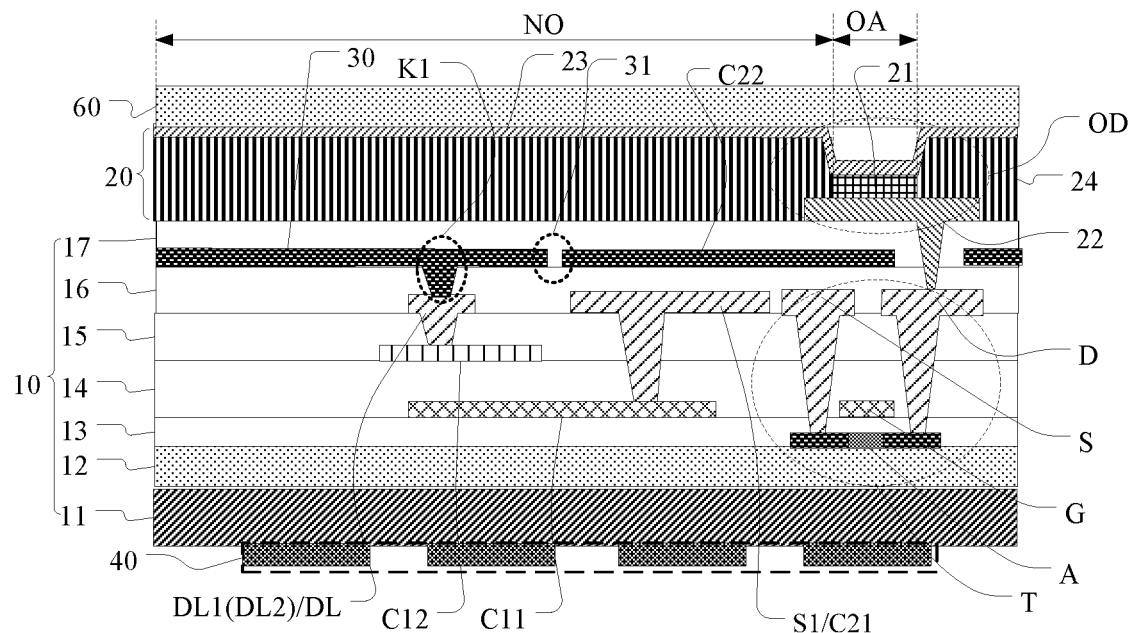
FIG. 9 illustrates a film layer structure of another exemplary display panel consistent with the disclosed embodiments.

FIG. 9 illustrates a film layer structure of another exemplary display panel. In one embodiment, as shown in FIG. 4 and FIG. 9, the holding module M2 includes a first storage capacitor C1 and a second storage capacitor C2. The first storage capacitor C1 includes a first electrode plate C11 and a second electrode plate C12. The first electrode plate C11 is disposed in a same layer with the gate G of the thin film transistor T, and the second electrode plate C12 is located between the film layer of the gate G and the film layer of the source S and the drain D. The second storage capacitor C2 includes a third electrode plate C21 and a fourth electrode plate C22. The third electrode plate C21 and the source S and drain D of the thin film transistor T are disposed in a same layer. The fourth electrode plate C22 reuses the light-shielding conductive layer 30.

In one embodiment, the light-shielding conductive layer is electrically connected to the power signal layer, and the light-shielding conductive layer thus has a certain electric potential. On the basis of this, a plate is disposed in a same layer with the source S and drain D of the thin film transistor and opposite to the light-shielding conductive layer. The plate and the light-shielding conductive layer form a second storage capacitor. Accordingly, the holding module of the pixel circuit includes two storage capacitors, and the capacitance value of the storage capacitor is thus increased. In such a configuration, the time for the holding module to maintain the driving current output of the driving transistor may be increased. Thus, the light-emitting efficiency of the organic light-emitting device may be improved, and the display quality of the display panel may be improved.

In one embodiment, referring to FIG. 4 and FIG. 9, the first electrode plate C11 is electrically connected to the first signal line S1, wherein the first signal line S1 is reused as the third electrode plate C21. The second electrode plate C12 is electrically connected to the power signal layer DL. The electric potential of the first signal line S1 is different from the electric potential of the power signal layer DL. The first signal line S1 may be any one of the signal lines in the pixel circuit disposed in a same layer with the source S and the drain D, while the electric potential of first signal line S1 is different from the electric potential of the power signal layer DL.

In one embodiment, referring to FIG. 4 and FIG. 9, the first substrate 10 of the display panel includes a substrate layer 11 and a plurality of conductive layers on a side of the substrate layer 11 adjacent to the second substrate 60, and insulation layers between adjacent conductive layers.

Specifically, the first substrate 10 includes a substrate layer 11, a buffer layer 12 located on a side of the substrate layer 11 adjacent to the organic light-emitting display layer 21, and a semiconductor material layer located above a side of the buffer layer 12 away from the substrate layer 11. The semiconductor material layer may be used for disposing an active layer A. The first substrate 10 also includes a gate insulating layer 13 on a side of the semiconductor material layer away from the buffer layer 12, and a first conductive layer, located on a side of the gate insulating layer 13 away from the semiconductor material layer, for disposing the gate G of the thin film transistor T and the first electrode plate C11.

The first substrate 10 also includes a first interlayer insulating layer 14 on a side of the first conductive layer away from the gate insulating layer 13, and a second conductive layer located on a side of the first interlayer insulating layer 14 away from the first conductive layer, for disposing the second electrode plate C12. The first substrate 10 also includes a second interlayer insulating layer 15 located on a side of the second conductive layer away from the first interlayer insulating layer 14, and a third conductive layer located on a side of the second interlayer insulating layer 15 away from the second conductive layer, for disposing the source S, the drain D, the third electrode plate C21. The first substrate 10 also includes a passivation layer 16 on a side of the third conductive layer away from the second interlayer insulating layer 15, and a planarization layer 17 located on a side of the passivation layer 16 away from the third conductive layer.

Specifically, the light-emitting layer 20 includes an anode 22 located on a side of the planarization layer 17 away from the passivation layer 16, a pixel defining layer 24 located on a side of the anode 22 away from the planarization layer 17, and a cathode 23 located on a side of the pixel defining layer 24 away from the anode 22. The pixel defining layer 24 includes a non-opening area NO and an opening area OA exposing the anode 22. The organic light-emitting display layer 21 is located in the opening area OA. The cathode 23 covers the non-opening area NO and the organic light-emitting display layer 21.

In one embodiment, as shown in FIG. 9, the light-shielding conductive layer 30 is located between the passivation layer 16 and the planarization layer 17. In such a configuration, the light-shielding conductive layer 30 may not affect the light generated by the organic light-emitting device OD. Meanwhile, the distance between the light-shielding conductive layer 30 and the organic light-emitting device OD is small, so there may be a sufficient distance between the small imaging aperture 31 and the photosensitive device layer 40 for achieving small aperture imaging. The light-shielding conductive layer 30 is also disposed with a channel for providing a connection between the anode 22 and the thin film transistor T. Since the anode 22 is disposed at the channel, the regions between the small imaging apertures 31 are light-shielding areas. Accordingly, light reaching the photosensitive layer 40 from regions except the small imaging apertures 31 may be reduced, and the accuracy of fingerprint recognition may thus be improved.

In one embodiment, referring to FIG. 9, the power signal layer DL is located in the third conductive layer. That is, the power signal layer DL is disposed in a same conductive layer with the source S and drain D of the thin film transistor T. The conductive layer where the source S and the drain D of the thin film transistor T are located is a metal film layer with a titanium-aluminum-titanium structure, and the metal film layer has a small electric resistance. Accordingly, when the power signal layer DL is disposed in the metal film layer, the voltage drop gradient on the power signal layer DL may be small, and the uniformity of the power signal layer on the display panel may thus be improved.

When the power signal layer DL is disposed in a same layer with the source S of the thin film transistor T, the power signal layer DL may be a first power signal line DL1 that transmits a positive power signal or a second power signal line DL2 that transmits a negative power signal. The display panel also includes a first via hole K1. The first via hole K1 passes through the passivation layer 16. The light-shielding conductive layer 30 is electrically connected to the power signal layer DL through the first via hole K1.

Figure 10:
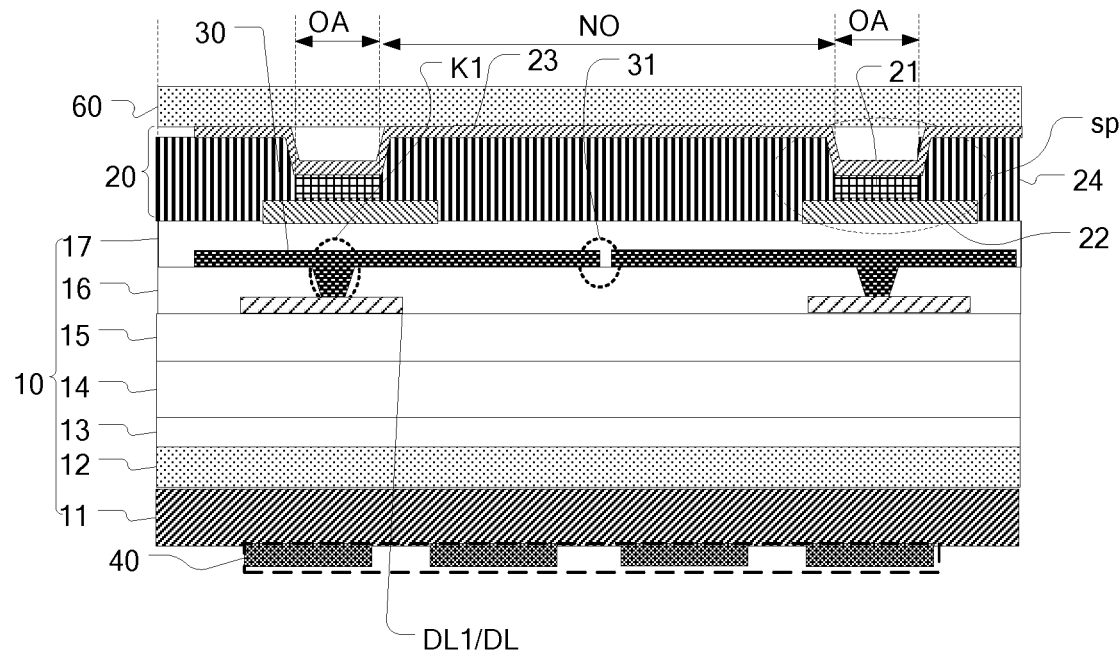
FIG. 10 illustrates a film layer structure of another exemplary display panel consistent with the disclosed embodiments.

FIG. 10 illustrates a film layer structure of another exemplary display panel. In one embodiment, referring to FIG. 5 and FIG. 10, the power signal layer DL is used to transmit a positive power signal. The power signal layer DL includes a plurality of first power signal lines DL1, and the first power signal lines DL1 are located on the display area AA of the display panel. An orthographic projection of the first via holes K1 on the organic light-emitting display layer 21 is covered by the sub-pixels sp.

In one embodiment, the power signal layer is the first power signal line located in the display area. Accordingly, the first via holes that connect the light-shielding conducting layer and the power signal layer are also located in the display area, and the first via holes are disposed in a region covered by the sub-pixels. That is, first via holes are not disposed in regions between the sub-pixels. As such, when small imaging apertures are disposed in the region between the sub-pixels on the light-shielding conductive layer, the small imaging apertures are not affected by the first via holes, and thus disposing imaging apertures may be flexible.

In one embodiment, referring to FIG. 10, the first via holes K1 are disposed in a one-to-one correspondence with the sub-pixels sp. That is, a connection channel between the light-shielding conductive layer and the power signal layer is disposed at a position of each sub-pixel. A sufficient number of the first via holes may lead to a further decrease in the electric resistance of the power signal layer. Meanwhile, when the sub-pixels are evenly arranged on the display panel, the first via holes are also evenly arranged on the display panel. Accordingly, the uniformity of the electric resistance of the power signal layer may be further improved.

Figure 11:
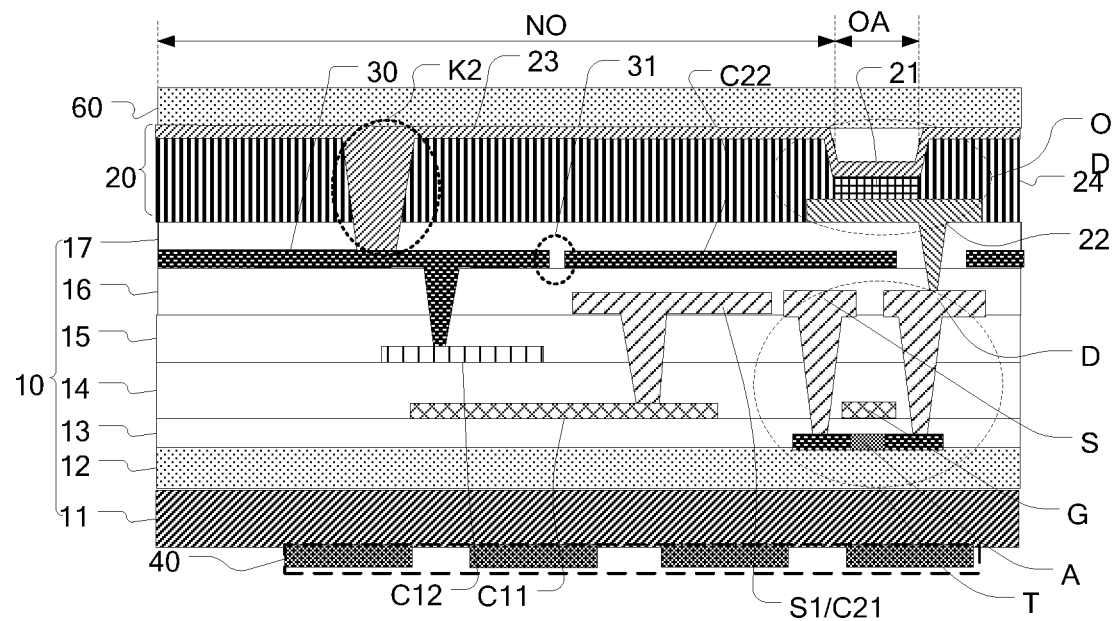
FIG. 11 illustrates a film layer structure of another exemplary display panel consistent with the disclosed embodiments.

FIG. 11 illustrates a film layer structure of another exemplary display panel. In one embodiment, referring to FIG. 11, the power signal layer DL is the cathode 23. The display panel includes second via holes K2 that pass through the pixel defining layer 24 and the planarization layer 17. The power signal layer DL is electrically connected to the light-shielding conductive layer 30 through the second via holes K2.

Figure 12:
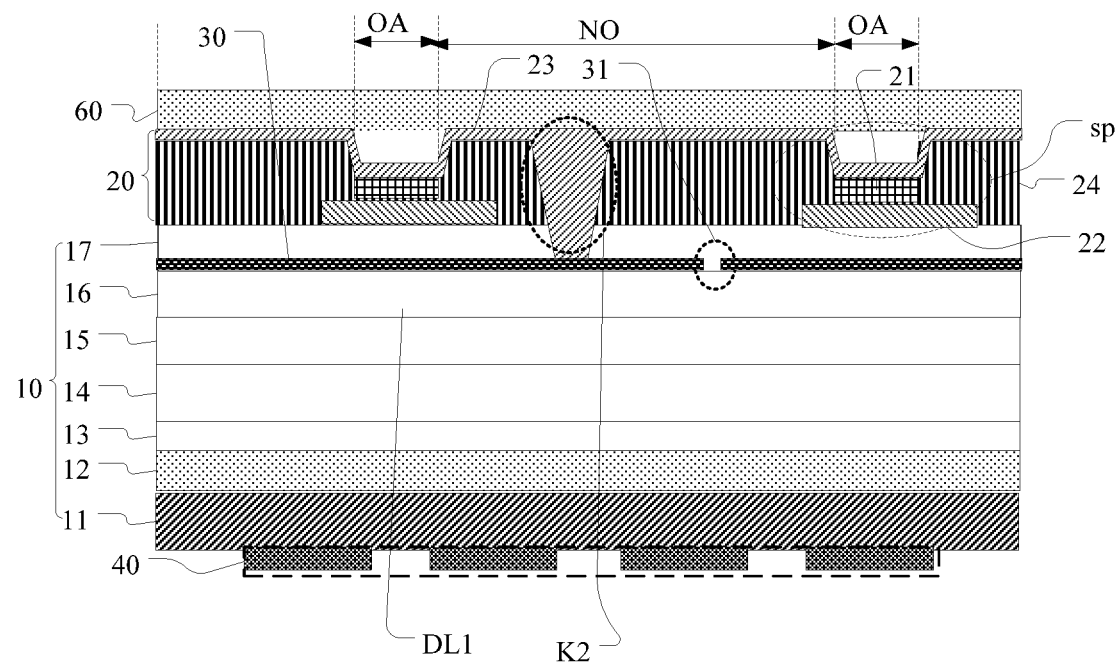
FIG. 12 illustrates a film layer structure of another exemplary display panel consistent with the disclosed embodiments.

FIG. 12 illustrates a film layer structure of another exemplary display panel. In one embodiment, as shown in FIG. 12, an orthographic projection of the second via holes K2 on the organic light-emitting display layer 21 are between two adjacent sub-pixels sp. Since the second via holes connecting the cathode and the light-shielding conductive layer are disposed between adjacent two sub-pixels, the influence of the second via holes on the sub-pixels may be avoided.

In one embodiment, as shown in FIG. 12, second via holes K2 are disposed between any two adjacent sub-pixels sp. A sufficient number of second via holes may lead to a further decrease of the electric resistance of the power signal layer. Meanwhile, when the sub-pixels are evenly arranged on the display panel, the second via holes are also evenly arranged on the display panel. The uniformity of the electric resistance of the power signal layer may thus be further improved.

Figure 13:
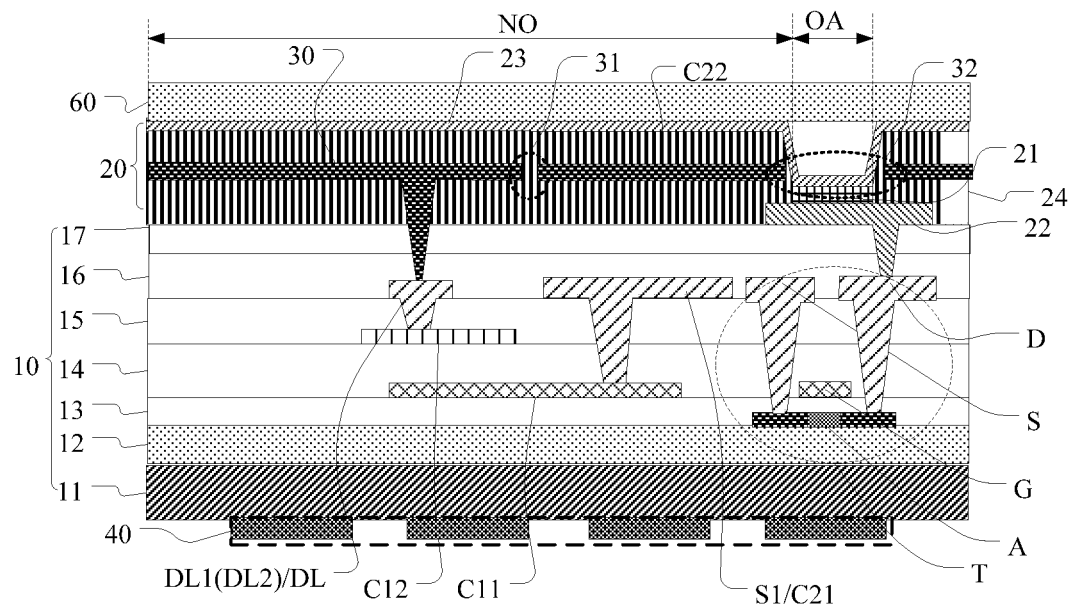
FIG. 13 illustrates a film layer structure of another exemplary display panel consistent with the disclosed embodiments.

FIG. 13 illustrates a film layer structure of another exemplary display panel. In one embodiment, as shown in FIG. 13, the light-shielding conductive layer 30 is located above the organic light-emitting display layer 21, and the light-shielding conductive layer 30 is located at a side of the cathode 23 adjacent to the anode 22. The light-shielding conductive layer 30 further includes pixel holes 32. The orthographic projection of the anode 22 on the light-shielding conductive layer 30 overlaps with the pixel holes 32.

In one embodiment, since the light-shielding conductive layer is located above the organic light-emitting display layer, the distance between the light-shielding conductive layer and the photosensitive device layer may be increased. Accordingly, the image recognition function based on small aperture imaging may be improved. At the same time, since the light-shielding conductive layer is disposed on a side of the cathode adjacent to the anode, and the pixel holes expose the anode, the influence of the light-shielding conductive layer on the display quality may be reduced or avoided.

The present disclosure further provides a display device. The display device includes any one or a combination of the display panels provided by the present disclosure, and has the technical features thereof and corresponding technical effects.

Figure 14:
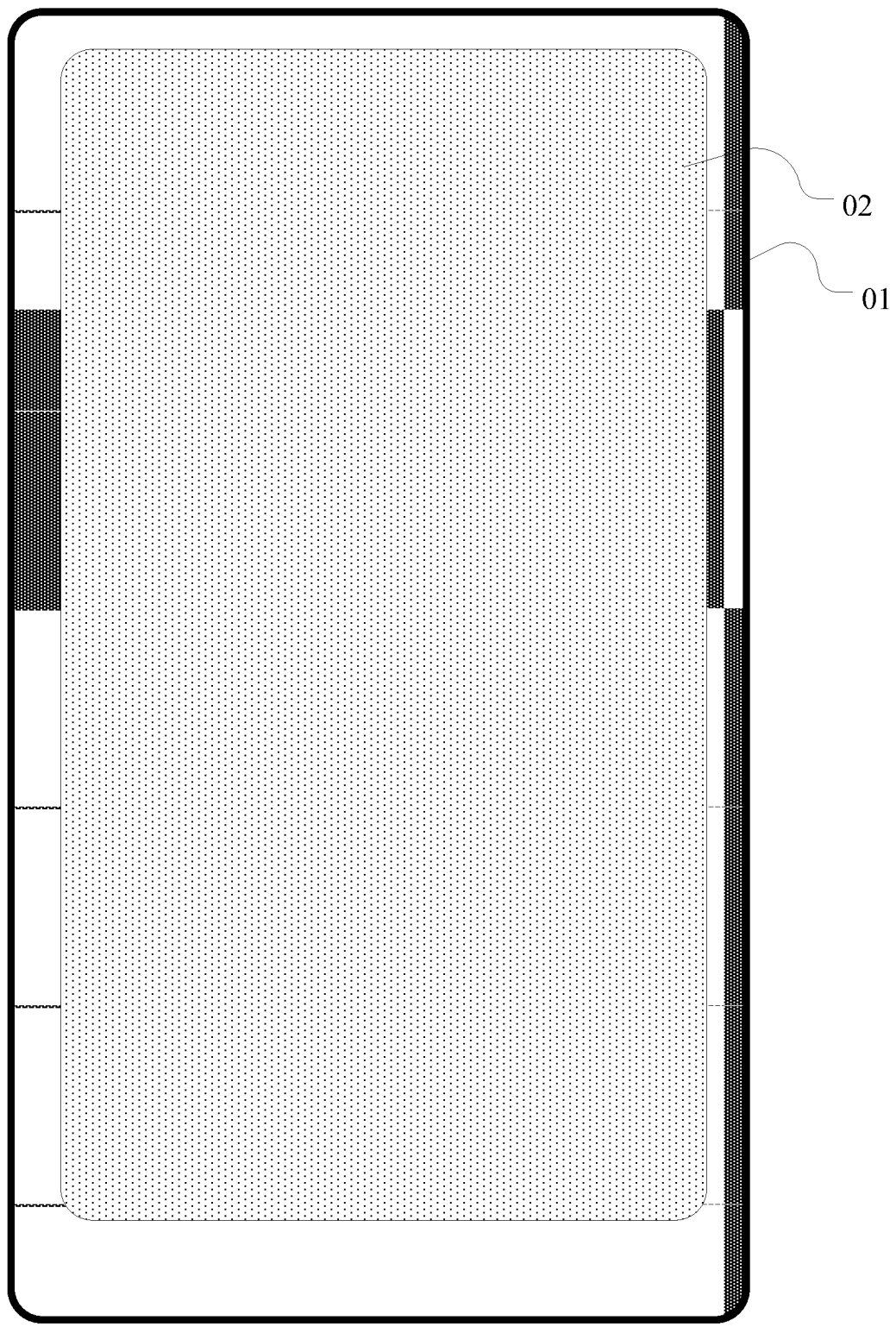
FIG. 14 illustrates an exemplary display device consistent with the disclosed embodiments.

FIG. 14 illustrates an exemplary display device. As shown in FIG. 14, the display device includes a casing 01 and a display panel 02 located in the casing 01. The display panel 02 may be any one or a combination of the display panels provided by the present disclosure.

As disclosed, the technical solutions of the present disclosure have the following advantages.

A material with both light shielding and electric conduction functions is used in forming a film layer where small imaging apertures are disposed. Accordingly, the film layer formed is a light-shielding conductive layer. Fingerprint recognition may be achieved based on small aperture imaging. Further, the light-shielding conductive layer may be electrically connected to a power signal layer. In a transmission path of power signals, the light-shielding conductive layer may act as a parallel resistance of the power signal layer. Accordingly, an impedance of a transmission line of the power signals may be reduced, and a voltage drop gradient of the power signals may thus be reduced. As such, uniformity of the power signals in the display panel may be improved, and the display quality of the display panel may thus be improved.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this invention, such other modifications, equivalents, or improvements to the disclosed embodiments are intended to be encompassed within the scope of the present disclosure.

What is claimed is:

1. A display panel comprising:
   a substrate layer;
   an organic light-emitting display layer, located above a side of the substrate layer, wherein the organic light-emitting display layer includes a plurality of sub-pixels;
   a light-shielding conductive layer, located above a side of the substrate layer adjacent to the organic light-emitting display layer, wherein the light-shielding conductive layer includes a plurality of small imaging apertures, and an orthographic projection of each small imaging aperture on the organic light-emitting display layer is at least partially located between adjacent sub-pixels of the plurality of sub-pixels;
   a photosensitive device layer, located below a side of the light-shielding conductive layer away from a light-emitting surface of the display panel; and
   a power signal layer, electrically connected to the light-shielding conductive layer.

2. The display panel according to claim 1, wherein the light-shielding conductive layer is located between the substrate layer and the organic light-emitting display layer.

3. The display panel according to claim 1, wherein the light-shielding conductive layer is located above a side of the organic light-emitting display layer away from the substrate layer.

4. The display panel according to claim 1, wherein:
   the power signal layer is configured to transmit positive power signals;
   the power signal layer includes a plurality of first power signal lines; and
   the plurality of first power signal lines are located in a display area of the display panel.

5. The display panel according to claim 1, wherein:
   the power signal layer is configured to transmit negative power signals;
   the power signal layer includes a second power signal line surrounding a display area of the display panel; and
   the second power signal line is located in a border area of the display panel.

6. The display panel according to claim 1, wherein:
   the display panel further includes a plurality of anodes;
   the power signal layer is a cathode;
   the organic light-emitting display layer is located between each anode and the cathode;
   the plurality of anodes is disposed in a one-to-one correspondence with the plurality of sub-pixels; and the cathode is a whole continuous layer structure corresponding to the plurality of anodes, and the plurality of sub-pixels share the cathode.

7. The display panel according to claim 1, each of the plurality of sub-pixels further comprising:
   at least one thin film transistor, including a drain, a source, an active layer, and a gate;
   a first storage capacitor, including a first electrode plate and a second electrode plate, wherein the first electrode plate is disposed in a same layer with the gate of the at least one thin film transistor, and the second electrode plate is located between a film layer containing the gate and a film layer containing the source/drain; and
   a second storage capacitor, including a third electrode plate and a fourth electrode plate, wherein the third electrode plate is disposed in a same layer with the source and the drain of the at least one thin film transistor, and the light-shielding conductive layer is used as the fourth electrode plate.

8. The display panel according to claim 7, wherein:
   the first electrode plate is electrically connected to a first signal line, wherein the first signal line is reused as the third electrode plate; and
   the second electrode plate is electrically connected to the power signal layer, wherein an electric potential of the first signal line is different from an electric potential of the power signal layer.

9. The display panel according to claim 7, further comprising:
   a buffer layer, located on a side of the substrate layer adjacent to the organic light-emitting display layer;
   a semiconductor material layer, located on a side of the buffer layer away from the substrate layer, for disposing the active layer;
   a gate insulating layer, located on a side of the semiconductor material layer away from the buffer layer;
   a first conductive layer, located on a side of the gate insulating layer away from the semiconductor material layer, for disposing the gate of the thin film transistor and the first electrode plate;
   a first interlayer insulating layer, located on a side of the first conductive layer away from the gate insulating layer;
   a second conductive layer, located on a side of the first interlayer insulating layer away from the first conductive layer, for disposing the second electrode plate;
   a second interlayer insulating layer, located on a side of the second conductive layer away from the first interlayer insulating layer;
   a third conductive layer, located on a side of the second interlayer insulating layer away from the second conductive layer, for disposing the source, the drain and the first signal line;
   a passivation layer, located on a side of the third conductive layer away from the second interlayer insulating layer;
   a planarization layer, located on a side of the passivation layer away from the third conductive layer;
   the anode, located on a side of the planarization layer away from the passivation layer;
   a pixel defining layer, located on a side of the anode away from the planarization layer, wherein the pixel defining layer includes a non-opening area and an opening area exposing the anode, and the organic light-emitting display layer is located in the opening area; and
   the cathode, located on a side of the pixel defining layer away from the anode, wherein the cathode covers the non-opening area and the organic light-emitting display layer.

10. The display panel according to claim 9, wherein:
    the light-shielding conductive layer is located between the passivation layer and the planarization layer; and
    areas between the small imaging apertures are light-shielding areas.

11. The display panel according to claim 10, wherein:
    the power signal layer is located in the third conductive layer; and
    the display panel also includes first via holes, wherein the first via holes pass through the passivation layer, and the light-shielding conductive layer is electrically connected to the power signal layer through the first via holes.

12. The display panel according to claim 11, wherein:
    the power signal layer is configured to transmit positive power signals, wherein the power signal layer includes a plurality of first power signal lines, and the plurality of first power signal lines are located in a display area of the display panel; and
    orthographic projections of the first via holes on the organic light-emitting display layer are covered by the sub-pixels.

13. The display panel according to claim 12, wherein the first via holes are disposed in a one-to-one correspondence with the sub-pixels.

14. The display panel according to claim 11, wherein:
    the power signal layer is the cathode; and
    the display panel includes second via holes that pass through the pixel defining layer and the planarization layer, wherein the power signal layer is electrically connected to the light-shielding conductive layer through the second via holes.

15. The display panel according to claim 14, wherein orthographic projections of the second via holes on the organic light-emitting display layer are between adjacent sub-pixels.

16. The display panel according to claim 15, wherein the second via holes are disposed between any two adjacent sub-pixels.

17. The display panel according to claim 9, wherein:
    the light-shielding conductive layer is located at a side of the cathode adjacent to the anode; and
    the light-shielding conductive layer also includes pixel holes, wherein an orthographic projection of the anode on the light-shielding conductive layer overlaps with the pixel hole.

18. The display panel according to claim 1, wherein the light-shielding conductive layer has a film thickness greater than or equal to about 150 nanometers and less than or equal to 300 nanometers.

19. The display panel according to claim 1, wherein the small imaging apertures have a diameter greater than or equal to about 5 micrometers and less than or equal to about 10 micrometers.

20. A display device, comprising the display panel according to claim 1.

* * * * *